(12) United States Patent
Ravnkilde et al.

(10) Patent No.: US 10,136,226 B2
(45) Date of Patent: Nov. 20, 2018

(54) TOP-PORT MEMS MICROPHONE AND METHOD OF MANUFACTURING THE SAME

(71) Applicant: EPCOS AG, Munich (DE)

(72) Inventors: Jan Tue Ravnkilde, Hedehusene (DK); Marcel Giesen, Munich (DE); Kurt Rasmussen, Herlev (DK); Morten Ginnerup, Kongens Lyngby (DK); Pirmin Hermann Otto Rombach, Kongens Lyngby (DK); Wolfgang Pahl, Munich (DE); Anton Leidl, Hohenbrunn (DE); Armin Schober, Munich (DE); Jürgen Portmann, Munich (DE)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/653,820

(22) PCT Filed: Dec. 18, 2012

(86) PCT No.: PCT/EP2012/076022
§ 371 (c)(1),
(2) Date: Jun. 18, 2015

(87) PCT Pub. No.: WO2014/094831
PCT Pub. Date: Jun. 26, 2014

(65) Prior Publication Data
US 2015/0326979 A1 Nov. 12, 2015

(51) Int. Cl.
*H04R 19/00* (2006.01)
*H04R 1/04* (2006.01)
*H04R 31/00* (2006.01)
*H04R 19/04* (2006.01)
*B81B 7/00* (2006.01)

(52) U.S. Cl.
CPC ......... *H04R 19/005* (2013.01); *B81B 7/0016* (2013.01); *H04R 1/04* (2013.01); *H04R 19/04* (2013.01); *H04R 31/00* (2013.01); *B81B 2207/115* (2013.01); *H04R 31/006* (2013.01); *H04R 2201/003* (2013.01)

(58) Field of Classification Search
CPC . H04R 1/08; H04R 9/08; H04R 11/04; H04R 17/02; H04R 21/02; H04R 19/005
USPC ................. 381/369, 175, 178, 356; 357/416
See application file for complete search history.

(56) References Cited

U.S. PATENT DOCUMENTS

| 4,232,205 | A | * | 11/1980 | Ribeyre | ................... | H04R 1/08 |
| | | | | | | 381/162 |
| 5,282,245 | A | * | 1/1994 | Anderson | ............... | H04M 1/19 |
| | | | | | | 381/356 |
| 6,512,450 | B1 | * | 1/2003 | Burnett | ................... | G08B 3/10 |
| | | | | | | 340/384.1 |

(Continued)

FOREIGN PATENT DOCUMENTS

EP  2037700 A2  3/2009
JP  0729946 U   6/1995
(Continued)

*Primary Examiner* — Suhan Ni
(74) *Attorney, Agent, or Firm* — Slater Matsil, LLP

(57) ABSTRACT

A top-port MEMS-microphone has an upper side and a bottom side. The microphone includes a MEMS chip with a monolithically connected protection element at the upper side, a backplate, and a membrane. The microphone also includes a sound inlet at the upper side and a mechanical or electrical connection at the bottom side.

17 Claims, 3 Drawing Sheets

(56) References Cited

U.S. PATENT DOCUMENTS

| | | |
|---|---|---|
| 6,522,762 B1 | 2/2003 | Mullenborn et al. |
| 6,732,588 B1 | 5/2004 | Mullenborn et al. |
| 6,781,231 B2 | 8/2004 | Minervini |
| 6,901,804 B2 * | 6/2005 | Torkkeli ............ B81C 1/00158 |
| | | 381/175 |
| 7,292,696 B2 * | 11/2007 | Saeki .................. H04R 19/016 |
| | | 381/175 |
| 7,301,213 B2 * | 11/2007 | Matsubara ............ B06B 1/0292 |
| | | 381/175 |
| 7,940,944 B2 * | 5/2011 | Song .................... H04R 19/016 |
| | | 381/175 |
| 8,188,557 B2 * | 5/2012 | Rombach ............... H04R 31/00 |
| | | 381/175 |
| 8,860,154 B2 * | 10/2014 | Wang ..................... H04R 19/04 |
| | | 257/254 |
| 2006/0233400 A1 * | 10/2006 | Ohbayashi ........... H04R 19/016 |
| | | 381/175 |
| 2010/0119097 A1 | 5/2010 | Ohtsuka |

FOREIGN PATENT DOCUMENTS

| | | |
|---|---|---|
| JP | 2003508998 A | 3/2003 |
| JP | 2007028671 A | 2/2007 |
| JP | 2009044600 A | 2/2009 |
| JP | 2012088688 A | 5/2012 |
| JP | 5062240 B2 | 10/2012 |
| WO | 9701258 A1 | 1/1997 |
| WO | 0119134 A2 | 3/2001 |
| WO | 2009022459 A1 | 2/2009 |
| WO | 2011132062 A1 | 10/2011 |
| WO | 2012088688 A1 | 7/2012 |
| WO | 2012091697 A1 | 7/2012 |

* cited by examiner

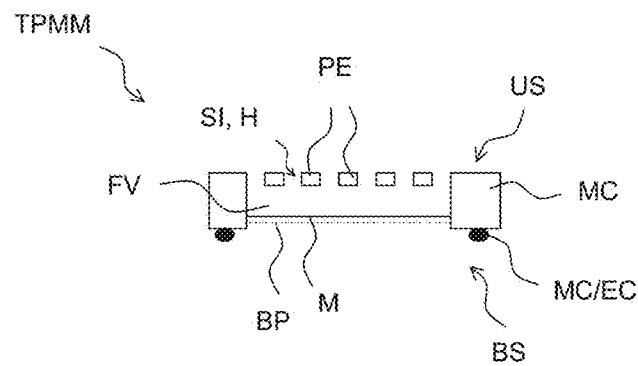
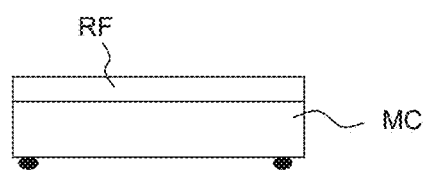
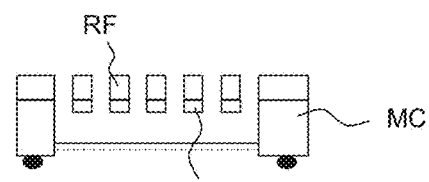
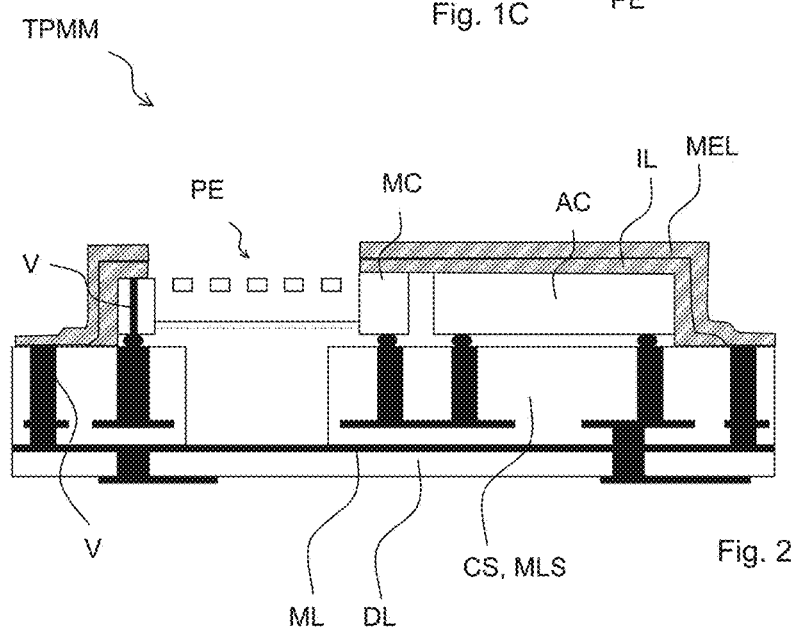

TOP-PORT MEMS MICROPHONE AND METHOD OF MANUFACTURING THE SAME

This patent application is a national phase filing under section 371 of PCT/EP2012/076022, filed Dec. 18, 2012, which is incorporated herein by reference in its entirety.

TECHNICAL FIELD

The present invention refers to top-port MEMS microphones, i.e., to MEMS microphones which have a sound inlet at an upper side and electrical or mechanical connection means at a bottom side, and methods for manufacturing such microphones.

BACKGROUND

MEMS microphones (MEMS=Micro-Electro-Mechanical System) usually comprise a membrane/backplate pair that is arranged on the microphone's MEMS chip or in a cavity in the chip.

MEMS microphones are known, e.g., from U.S. Pat. No. 6,522,762, U.S. Pat. No. 6,781,231, or U.S. Pat. No. 6,732,588.

The volume between the sound inlet and the membrane/backplate pair is the front volume of the microphone. A large front volume decreases the microphone's performance and deteriorates the high audio frequency performance of a microphone. A small front volume can be obtained when the membrane/backplate pair is arranged near the sound inlet. However, a close proximity to the sound inlet increases the probability of the pair being destroyed by objects or by matter entering the sound inlet.

Another possibility of reducing the front volume is realized by arranging the pair at the bottom side of the MEMS chip and reducing the chip's thickness. However, then, the mechanical stability of the chip is jeopardized, although a thin chip is generally preferred following the present trend towards miniaturization of electric components.

Further, it is possible to arrange the membrane/backplate pair at the bottom side of the MEMS chip and provide a protection element, e.g., a grid as shown in U.S. Pat. No. 6,522,762, placed onto the upper side of the chip covering the sound inlet.

SUMMARY

Embodiments of the present invention provide a MEMS microphone that allows miniaturization while maintaining good acoustic properties and acoustic and electric performance.

Further embodiments provide a method for manufacturing such a MEMS microphone.

A top-port MEMS microphone has an upper side and a bottom side. The microphone comprises an MEMS chip with a monolithically connected protection element at the upper side, a backplate, and a membrane. The microphone further comprises a sound inlet at the upper side and a mechanical or electrical connection at the bottom side of the microphone. The monolithically connected protection element establishes an integral part of the MEMS chip. The protection element protects the sound inlet from objects or matter reaching into the sound inlet.

Further, the protection element reinforces the MEMS chip and enhances the mechanical stability thereof. As a result, the thickness of the MEMS chip can be reduced compared to known MEMS microphones resulting in a decreased front volume. The backplate and the membrane can be arranged at the bottom of the MEMS chip.

In one embodiment, the protection element is arranged in the sound inlet. The sound inlet can be a cavity above the membrane/backplate pair. The cavity can be a hole in the MEMS chip. When the protection element is arranged in the sound inlet, no elements of the protection element protrude from the MEMS chip and a miniaturized MEMS microphone can be obtained.

In one embodiment, the sound inlet defines the front volume and is arranged in the MEMS chip. The sound inlet has an inside and the protection element is a grid connected to the inside of the sound inlet. The grid has a stiffness and as the protection element is monolithically connected to the MEMS chip, the protection element's stiffness increases the MEMS chip's stiffness resulting in a reinforcement of the MEMS chip.

In one embodiment, the protection element flushes with the upper side of the MEMS chip.

In one embodiment, the MEMS chip has a rectangular cross-section and the front volume and the protection element have a mainly circular cross-section. The rectangular cross-section of the MEMS chip can be obtained by sawing a wafer comprising a plurality of MEMS chips one next to the other into pieces. Thus, rectangular MEMS chips allow a simple manufacturing process of the chips. A circular cross-section of the front volume and, thus, of the protection element, corresponds to the usual circular shape of the membrane/backplate pair and allows basic oscillation modes of the membrane without unnecessary stimulation of harmonic resonances.

Further, a circular cross-section of the front volume can easily be obtained according to manufacturing steps discussed below.

In one embodiment, the protection element has holes that have a cross-section increasing with increasing depth.

In one embodiment, the microphone further comprises a carrier substrate where the MEMS chip is electrically or mechanically connected to the carrier substrate.

The carrier substrate may be a multi-layer ceramic carrier substrate with metallization plains between dielectric, e.g., ceramic, layers.

It is possible that the MEMS microphone further comprises an ASIC chip (ASIC=Application-Specific Integration Circuit) that may be arranged next to the MEMS chip.

It is possible that the MEMS chip and/or an ASIC chip and/or section of the carrier substrate are covered by a polymer foil.

It is further possible that the MEMS chip and/or an ASIC chip and/or sections of the carrier substrate are covered by a metal layer. The metal layer can be deposited with the help of a galvanic process that increases the thickness of a sputtered thin metal layer. To protect the MEMS microphone from liquid during such a galvanic process, the polymer foil protects especially the sensitive elements: the membrane/backplate pair.

It is, of course, preferred that the polymer foil and the metal layer cover the whole MEMS chip during manufacturing. However, the area of the sound inlet has to be free. Thus, during a late manufacturing step, a section of the polymer foil and/or the metal layer can be removed in the area of the sound inlet utilizing a laser ablation system. It is possible to use a tilted laser ablation system where the beam hits the microphone not perpendicularly, but under an angle, e.g., 45°.

Such an MEMS microphone has a flat frequency response and yields a good microphone performance compared to conventional top-port microphones. Especially, such a microphone achieves microphone performances of bottom port microphones.

The MEMS chip can have a thickness of 300 µm to 600 µm. The protection element can have a thickness of 10 to 15 µm. Holes in the protection element can have a width of 20 to 50 µm. The sound inlet and/or the cavity between the protection element and the membrane/backplate pair can have a diameter of 600 µm to 1,500 µm.

The resist film can have a thickness of 10 µm.

It is possible that the protective element is formed directly in the bulk of the MEMS chip, e.g., in the MEMS chip's substrate.

It is possible that the MEMS chip comprises silicon. The MEMS chip can be a single crystal silicon chip.

The MEMS chip's substrate can be modified, e.g., by doping, to achieve a high conductivity. The conductivity can be so high that the protective element protects from mechanical threats and electrical threats, e.g., electrical static discharge (ESD) and electromagnetic interference (EMI).

A method of manufacturing a top-port microphone comprises steps: providing a monolithic MEMS chip with an upper side and a bottom side, and structuring a protection element monolithically connected to the MEMS chip at the upper side of the MEMS chip.

In one embodiment of the method, holes in the upper side of the MEMS chip are created during the step of structuring the protection element.

In one embodiment, the holes are arranged in a grid pattern.

In one embodiment, the method further comprises the step of structuring a front volume under the protection element.

In one embodiment of the manufacturing method, the holes are structured via an etching process and the front volume is structured via the same etching process.

In one embodiment, the method comprises arranging a resist film on the upper side of the MEMS chip, and structuring the resist film.

Usually, thickness reduction is limited by the stiffness of the remaining MEMS chip. The MEMS chip becomes with reduced thickness more fragile the larger the hole through the MEMS chip is. Establishing a frame according to the above embodiments allows to obtain a stable and thin chip.

When the protection element is realized via etching techniques, ion beam etching utilizing $SF_6$ can be used to etch holes in the protection element. Therefore, a resist film can be arranged on top of the MEMS chip. The resist film can be structured via photolithographic steps. The remaining parts of the resist film define the structure of the protection element and recesses in the resist film allow $SF_6$ ions to remove material of the MEMS chip.

BRIEF DESCRIPTION OF THE DRAWINGS

Examples of MEMS microphones are shown in the schematic figures, which include

FIG. 1A shows the basic working principle of the MEMS microphone;

FIG. 1B shows a manufacturing step where a resist film is deposited on the upper side of the MEMS chip;

FIG. 1C shows a manufacturing step where the resist film and the protection element at the upper side of the MEMS chip have been structured;

FIG. 2 shows an embodiment of an MEMS microphone where the MEMS chip and an ASIC chip are arranged on a multi-layer substrate;

DETAILED DESCRIPTION OF ILLUSTRATIVE EMBODIMENTS

FIG. 1A schematically shows a cross-section through a top-port MEMS microphone TPMM comprising a MEMS chip MC with a membrane M and backplate BP. The membrane M and the backplate BP establish a transducer pair arranged at a bottom side BS of the MEMS chip MC. At an upper side US of the MEMS chip MC, a protection element PE comprising a plurality of holes H is arranged. The protection element PE may comprise a plurality of sections that may or may not be connected to each other.

The front volume FV is arranged between the protection element PE and the membrane/backplate pair. The protection element PE protects the sound inlet SI from objects or matter that would otherwise deteriorate the performance of the microphone.

The protection element PE is monolithically connected to the MEMS chip and can, thus, comprise the same material of the MEMS chip MC. It is especially possible that the protection element PE is created by drilling or etching holes H into a top-portion of the MEMS chip MC leaving the later protection element PE as remaining material of the MEMS chip MC unchanged. The protection element PE enhances the mechanical stability of the MEMS chip allowing the chip to be thinner than comparable chips without a monolithic integration of a protection element.

FIG. 1B shows the situation before the protection element is formed. A resist film RF is deposited on the upper side US of the MEMS chip. The front volume can be formed in the same etching step of the protection element or—due to the finite etching rate—immediately after the etching of the holes of the protection element.

FIG. 1C shows the situation after forming the protection element: The resist film had been structured and the protection element PE has been formed by establishing holes into the monolithic material of the CHIP at locations defined by holes in the structured resist film.

FIG. 2 shows an embodiment of the top-port MEMS microphone TPMM where the MEMS chip MC with the protection element PE is arranged on a carrier substrate CS, e.g., a multi-layer substrate MLS comprising dielectric layers DL and metallization layers ML. Vias V through certain dielectric layers connect respective segments of metallization layers ML. Thus, electric circuit components such as coils or capacitors can be established in the metallization layers ML of the multi-layer substrate MLS and connected via the vias.

Next to the MEMS chip MC, an ASIC chip AC is arranged and electrically and mechanically connected to the multi-layer substrate MLS. An insulating layer IL covers the ASIC chip and sections of the MEMS chip MC leaving the sound inlet of the microphone uncovered. Further, a metal layer MEL covers the isolation layer IL. The metal layer MEL can be connected to circuitry of the multi-layer substrate MLS, e.g., to establish a ground connection preferred for electrical shielding.

Figure 3:
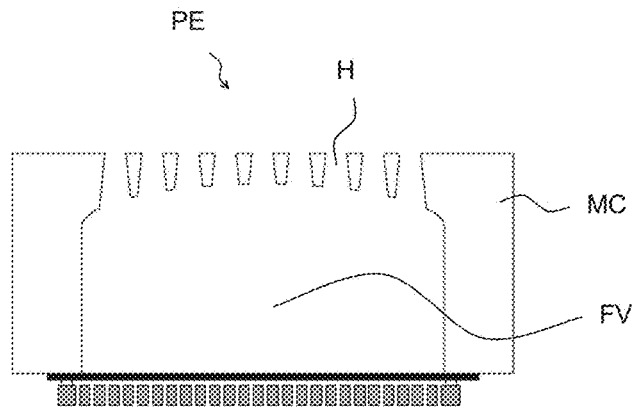
FIG. 3 shows an embodiment of the microphone chip and the protection element where the holes in the protection element increase with increasing depth.

FIG. 3 shows the cross-section through the MEMS chip MC and the protection element PE. Holes H in the protection element PE have a cross-section that increases with increasing depth, i.e., with increasing distance from the top surface of the chip MC. This can be obtained when an ion beam hits the MEMS chip MC from different angles. From a certain depth on the width of the remaining segments of the protection element PE becomes zero and a cavity establishing the front volume FV is obtained. The depth can depend on the distance from the hole to the center of the protection element.

Figure 4:
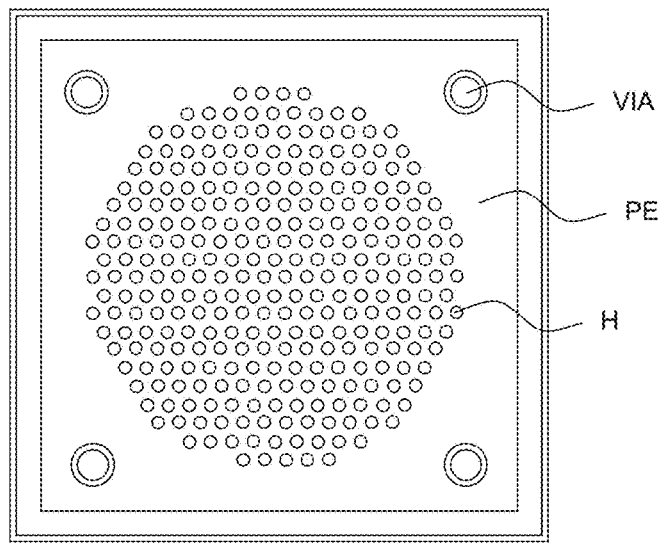
FIG. 4 shows a top view onto the protection element comprising a plurality of holes.

FIG. 4 shows a top view onto the protection element PE comprising a plurality of holes H in a circular area above the front volume FV. The holes H can be arranged in a hexagonal pattern.

Figure 5:
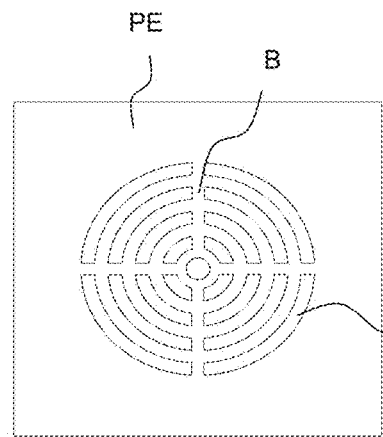
FIG. 5 shows another embodiment of the protection element.

FIG. 5 shows another embodiment of the protection element PE. The holes H in this embodiment do not have a circular cross-section but a cross-section of circle segments with a different diameter. Four bridging structures B connect the remaining segments of the protection element PE.

Figure 6:
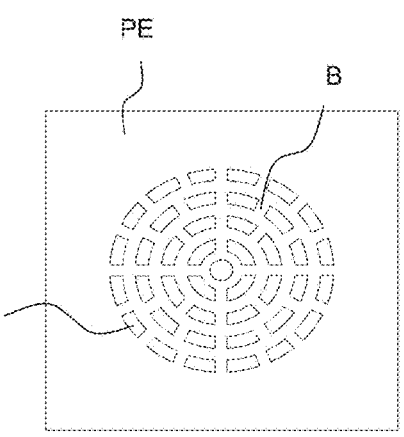
FIG. 6 shows another embodiment of the protection element.

FIG. 6 shows another embodiment of the protection element where the holes H are arranged in circular segments and interrupted by a plurality of bridging structures B.

Figure 7:
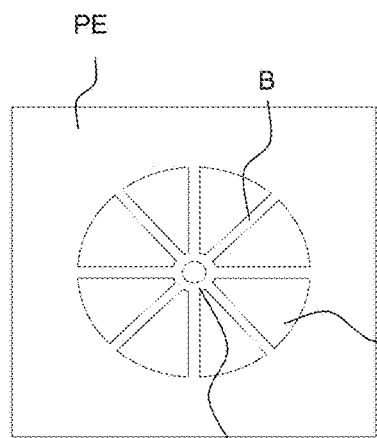
FIG. 7 shows another embodiment of the protection element.

FIG. 7 shows an embodiment of the protection element PE where eight bridging structures B separate the segment shaped hole areas H.

Figure 8:
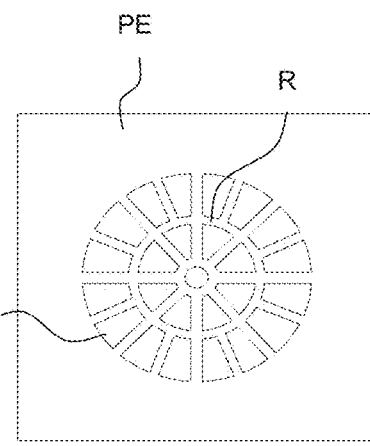
FIG. 8 shows another embodiment of the protection element.

FIG. 8 shows another embodiment of the protection element PE. The embodiment of FIG. 8 can be obtained by leaving a ring structure relative to the embodiment shown in FIG. 7.

In the embodiments shown in FIGS. 5 to 8, a center hole in the protection element PE is arranged in the center of the protection element. The center hole is belted by an inner ring structure R of the protection element PE.

An MEMS microphone is not limited to the embodiments described in the specification or shown in the figures. Top-port microphones comprising further structural protection elements or further circuit elements are also comprised by the present invention.

The invention claimed is:

1. A top-port Micro-Electro-Mechanical System (MEMS)-microphone, having an upper side and a bottom side, the top-port microphone comprising:
   a MEMS chip with a monolithically connected protection element at the upper side, a backplate, a cavity, and a moveable membrane, wherein the moveable membrane and the backplate together are configured to convert acoustic signals into electric signals, wherein the backplate and the moveable membrane are arranged at the bottom side of the MEMS chip, wherein the protection element is a grid having holes extending therethrough, and wherein the protection element is an integral portion of the MEMS chip;
   a sound inlet at the upper side; and
   a mechanical or electrical connection at the bottom side;
   wherein a body of the MEMS chip extends contiguously from a first side of the body, through the protection element, to a second side of the body; and
   wherein the first side of the body, the second side of the body, the protection element, and the movable membrane define the cavity.

2. The top-port microphone of claim 1, wherein the protection element is arranged in the sound inlet.

3. The top-port microphone of claim 1, wherein the sound inlet defines a front volume, wherein the sound inlet is arranged in the MEMS chip, and wherein the sound inlet has an inside.

4. The top-port microphone of claim 3, wherein the MEMS chip has a rectangular cross section, and wherein the front volume and the protection element have a circular cross section.

5. The top-port microphone of claim 3, wherein the protection element is a grid connected to the inside of the sound inlet.

6. The top-port microphone of claim 1, wherein the protection element is flush with the upper side of the MEMS chip.

7. The top-port microphone of claim 6, where the protection element has holes that have a cross section that increases with increasing depth.

8. The top-port microphone of claim 1, wherein the MEMS chip has a rectangular cross section.

9. The top-port microphone of claim 1, further comprising a carrier substrate, wherein the MEMS chip is electrically or mechanically connected to the carrier substrate.

10. A top-port Micro-Electro-Mechanical System (MEMS)-microphone, having an upper side and a bottom side, the top-port microphone comprising:
    a MEMS chip with a monolithically connected protection element at the upper side, a backplate, a cavity, and a membrane, wherein the backplate and the membrane are arranged at the bottom side of the MEMS chip, and wherein the protection element is an integral portion of the MEMS chip;
    a sound inlet at the upper side; and
    a mechanical or electrical connection at the bottom side, wherein the protection element is flush with the upper side of the MEMS chip, and wherein the protection element is a grid having holes extending therethrough and that have a cross section that increases with increasing depth;
    wherein a body of the MEMS chip extends contiguously from a first side of the body, through the protection element, to a second side of the body; and
    wherein the first side of the body, the second side of the body, the protection element, and the membrane define the cavity.

11. The top-port microphone of claim 10, wherein the protection element is arranged in the sound inlet.

12. The top-port microphone of claim 10, wherein the sound inlet defines a front volume, wherein the sound inlet is arranged in the MEMS chip, and wherein the sound inlet has an inside.

13. The top-port microphone of claim 12, wherein the MEMS chip has a rectangular cross section, and wherein the front volume and the protection element have a circular cross section.

14. The top-port microphone of claim 12, wherein the protection element is a grid connected to the inside of the sound inlet.

15. The top-port microphone of claim 10, wherein the MEMS chip has a rectangular cross section.

16. The top-port microphone of claim 10, further comprising a carrier substrate, wherein the MEMS chip is electrically or mechanically connected to the carrier substrate.

17. A top-port Micro-Electro-Mechanical System (MEMS) microphone, comprising:
    a MEMS chip having a backplate, a moveable membrane, and a cavity defining a front volume wherein a body of the MEMS has an integral portion that is a protection element disposed at an upper side of the MEMS microphone, and wherein a body of the MEMS chip extends contiguously from a first side of the body, through the protection element, to a second side of the body, wherein the first side of the body, the second side of the body, the protection element, and the movable membrane define the cavity, wherein the moveable membrane and the backplate, together, are configured to convert acoustic signals into electric signals, wherein the backplate and the moveable membrane are arranged at a bottom side of the MEMS chip, wherein the protection element is a grid having holes extending therethrough and acting as a sound inlet to the cavity; and a mechanical or electrical connection at the bottom side of the MEMS microphone.

* * * * *